(12) United States Patent
Knobloch et al.

(10) Patent No.: US 8,350,259 B2
(45) Date of Patent: Jan. 8, 2013

(54) ELECTRONIC CIRCUIT

(75) Inventors: Alexander Knobloch, Paderborn (DE); Walter Fix, Nuremberg (DE)

(73) Assignee: PolyIC GmbH & Co. KG, Furth (DE)

( * ) Notice: Subject to any disclaimer, the term of this patent is extended or adjusted under 35 U.S.C. 154(b) by 93 days.

(21) Appl. No.: 12/994,170

(22) PCT Filed: May 29, 2009

(86) PCT No.: PCT/EP2009/003844
§ 371 (c)(1), (2), (4) Date: Jan. 20, 2011

(87) PCT Pub. No.: WO2009/146850
PCT Pub. Date: Dec. 10, 2009

(65) Prior Publication Data
US 2011/0115101 A1 May 19, 2011

(30) Foreign Application Priority Data

May 30, 2008 (DE) .......................... 10 2008 026 216
May 29, 2009 (WO) ................. PCT/EP2009/003844

(51) Int. Cl.
H01L 29/08 (2006.01)
H01L 29/66 (2006.01)
H01J 63/04 (2006.01)

(52) U.S. Cl. .................. 257/40; 257/103; 257/E51.005; 257/E51.024; 313/504; 136/263

(58) Field of Classification Search .................. 257/750, 257/781, E23.116, 685, 723, E25.005, E25.011, 257/E25.012, E25.016, E25.026, 464, 759, 257/773, E23.114, E23.119, E23.132, 40, 257/103, E51.005, E51.024; 313/504; 136/263
See application file for complete search history.

(56) References Cited

U.S. PATENT DOCUMENTS
4,472,627 A 9/1984 Weinberger
(Continued)

FOREIGN PATENT DOCUMENTS
AU 488652 B2 4/1976
(Continued)

OTHER PUBLICATIONS
Relevant pages of International Search Report dated Oct. 7, 2009.
(Continued)

*Primary Examiner* — Jasmine Clark
(74) *Attorney, Agent, or Firm* — Carella, Byrne, et al.; Elliot M. Olstein; William Squire

(57) ABSTRACT

An electronic circuit includes at least two organic components interconnected by conductor tracks and having a common carrier substrate. The components and the conductor tracks are formed from layer portions. An uppermost layer portion, remote from the carrier substrate, of the electronic circuit is of a patterned configuration comprising an electrically conducting material. The patterned uppermost layer portion on its side remote from the carrier substrate is provided with at least one protective layer arranged in congruent relationship with the uppermost layer portion. The at least two organic components include at least one first component of a first component type and at least one second component of a second component type different therefrom. Components of the same component type are respectively protected by a protective layer of the same composition and/or the same structure corresponding to that component type and differing from one another according to the corresponding component type.

18 Claims, 3 Drawing Sheets

U.S. PATENT DOCUMENTS

| | | | |
|---|---|---|---|
| 4,726,659 A | 2/1988 | Conrad et al. | |
| 4,926,052 A | 5/1990 | Hatayama et al. | |
| 5,202,677 A | 4/1993 | Parker et al. | |
| 5,625,474 A | 4/1997 | Aomori et al. | |
| 5,629,530 A | 5/1997 | Brown et al. | |
| 5,946,551 A | 8/1999 | Dimitrakopoulos et al. | |
| 5,973,598 A | 10/1999 | Beigel | |
| 6,060,338 A | 5/2000 | Tanaka et al. | |
| 6,259,506 B1 | 7/2001 | Lawandy | |
| 6,281,952 B1 | 8/2001 | Okamoto et al. | |
| 6,318,760 B1 | 11/2001 | Shadel et al. | |
| 6,369,793 B1 | 4/2002 | Parker | |
| 6,407,669 B1 | 6/2002 | Brown et al. | |
| 6,414,728 B1 | 7/2002 | Faris et al. | |
| 6,506,438 B2 | 1/2003 | Duthaler et al. | |
| 6,661,563 B2 | 12/2003 | Hayashi et al. | |
| 6,753,994 B1 | 6/2004 | Russell | |
| 6,918,535 B1 | 7/2005 | Brosow | |
| 6,975,221 B2 | 12/2005 | Monck | |
| 7,017,808 B2 | 3/2006 | Holzer | |
| 7,018,297 B2 | 3/2006 | Henkel et al. | |
| 7,303,940 B2 | 12/2007 | Eder et al. | |
| 7,309,955 B2 | 12/2007 | Kim | |
| 7,342,245 B2 * | 3/2008 | Tanabe | 257/40 |
| 7,483,275 B2 | 1/2009 | Clemens et al. | |
| 7,504,953 B2 | 3/2009 | Forster | |
| 7,622,734 B2 * | 11/2009 | Suwa et al. | 257/40 |
| 7,737,851 B2 | 6/2010 | Trosper | |
| 7,849,993 B2 | 12/2010 | Finkenzeller | |
| 8,093,586 B2 * | 1/2012 | Shimoji et al. | 257/40 |
| 2002/0018911 A1 | 2/2002 | Bernius et al. | |
| 2002/0140557 A1 | 10/2002 | Dukler et al. | |
| 2003/0227664 A1 | 12/2003 | Agrawal et al. | |
| 2004/0051299 A1 | 3/2004 | Shadle et al. | |
| 2004/0092196 A1 | 5/2004 | Van De Witte et al. | |
| 2004/0156418 A1 | 8/2004 | Debord et al. | |
| 2004/0160389 A1 | 8/2004 | Suyama et al. | |
| 2004/0233065 A1 | 11/2004 | Freeman | |
| 2004/0246413 A1 | 12/2004 | Stephenson et al. | |
| 2005/0029343 A1 | 2/2005 | Neymann | |
| 2005/0116048 A1 | 6/2005 | Sauter et al. | |
| 2005/0128403 A1 | 6/2005 | Liu | |
| 2005/0211785 A1 | 9/2005 | Ferber | |
| 2005/0232530 A1 | 10/2005 | Kekas | |
| 2006/0040425 A1 * | 2/2006 | Tanabe | 438/108 |
| 2006/0262235 A1 | 11/2006 | Vogels et al. | |
| 2007/0024766 A1 | 2/2007 | Song et al. | |
| 2007/0252934 A1 | 11/2007 | Seo et al. | |
| 2008/0023705 A1 | 1/2008 | Yoon | |
| 2008/0067247 A1 | 3/2008 | McGregor et al. | |
| 2008/0198278 A1 | 8/2008 | Ludwig et al. | |
| 2009/0045918 A1 | 2/2009 | Droesler et al. | |
| 2009/0237248 A1 | 9/2009 | Clemens et al. | |
| 2010/0245112 A1 | 9/2010 | Ludwig et al. | |

FOREIGN PATENT DOCUMENTS

| | | |
|---|---|---|
| CA | 2032587 | 6/1991 |
| CA | 2374435 A1 | 12/2000 |
| DE | 3705109 A1 | 8/1987 |
| DE | 19648937 A1 | 5/1997 |
| DE | 10046332 A1 | 4/2001 |
| DE | 20111825 U1 | 2/2002 |
| DE | 10151440 C1 | 2/2003 |
| DE | 10141440 A1 | 3/2003 |
| DE | 10163267 A1 | 7/2003 |
| DE | 20314902 U1 | 1/2004 |
| DE | 10341962 A1 | 4/2004 |
| DE | 102004049139 A1 | 4/2005 |
| DE | 102004010094 B3 | 12/2005 |
| DE | 102005029420 A1 | 12/2006 |
| DE | 102005030626 A1 | 1/2007 |
| DE | 102006001487 A1 | 7/2007 |
| DE | 102006001854 A1 | 7/2007 |
| DE | 102006008345 B3 | 8/2007 |
| DE | 102006010159 A1 | 9/2007 |
| EP | 0435029 A2 | 7/1991 |
| EP | 0442123 A1 | 8/1991 |
| EP | 0785578 A2 | 7/1997 |
| EP | 0786820 A2 | 7/1997 |
| EP | 1134694 A1 | 9/2001 |
| EP | 1717862 A2 | 11/2006 |
| EP | 1881400 A1 | 1/2008 |
| GB | 2428889 | 2/2007 |
| JP | 09083040 A | 3/1997 |
| JP | 10026934 A | 1/1998 |
| WO | 9910769 A1 | 3/1999 |
| WO | 9913441 A2 | 3/1999 |
| WO | 9930432 A1 | 6/1999 |
| WO | 9953371 A1 | 10/1999 |
| WO | 9954842 A1 | 10/1999 |
| WO | 0005701 A1 | 2/2000 |
| WO | 0007151 A1 | 2/2000 |
| WO | 0076778 A1 | 12/2000 |
| WO | 03027948 A1 | 4/2003 |
| WO | 03054807 A2 | 7/2003 |
| WO | 03057501 A1 | 7/2003 |
| WO | 03085448 A1 | 10/2003 |
| WO | 2006025473 A1 | 3/2006 |
| WO | 2006110622 A2 | 10/2006 |
| WO | 2007041116 A1 | 4/2007 |

OTHER PUBLICATIONS

Examination report by German Patent Office dated Mar. 20, 2009.
Examination report by German Patent Office dated Jun. 25, 2009.
German Office Action dated Dec. 9, 2004 in copending application.
German Office Action dated Jul. 4, 2005 in copending application.
Written Opinion dated May 27, 2008 in copending European application.
German Office Action dated Sep. 19, 2007 in copending application.
Australian Office Action dated May 14, 2010 in copending application.
Australian Office Action dated Nov. 3, 2010 in copending application.
European Office Action dated Jan. 14, 2011 in copending application European.
International Search Report dated Jul. 4, 2005 in copending application.
International Search Report dated Jan. 26, 2009 in copending application.
International Search Report dated Dec. 10, 2004 in copending application.
Chinese Office Action dated Sep. 18, 2009 in copending application 200600284242.
Chinese Office Action in copending application 2005800424370.
Taiwanese Office Action dated Oct. 15, 2009.
European Office Action dated Sep. 26, 2007.
International Search Report dated Feb. 11, 2002 in related international application PCT/DE01/03164.
German Office Action dated Apr. 23, 2002 in related German Patent application No. DE2001P07562.
US Office Action dated Oct. 8, 2004 in related U.S. Appl. No. 10/344,926.
German Office Action dated Jan. 19, 2005 in related German Patent application No. DE 2001P03214.
US Office Action dated Jun. 1, 2007 in copending application.
European Office Action dated Jan. 28, 2010 in related EP application.

* cited by examiner

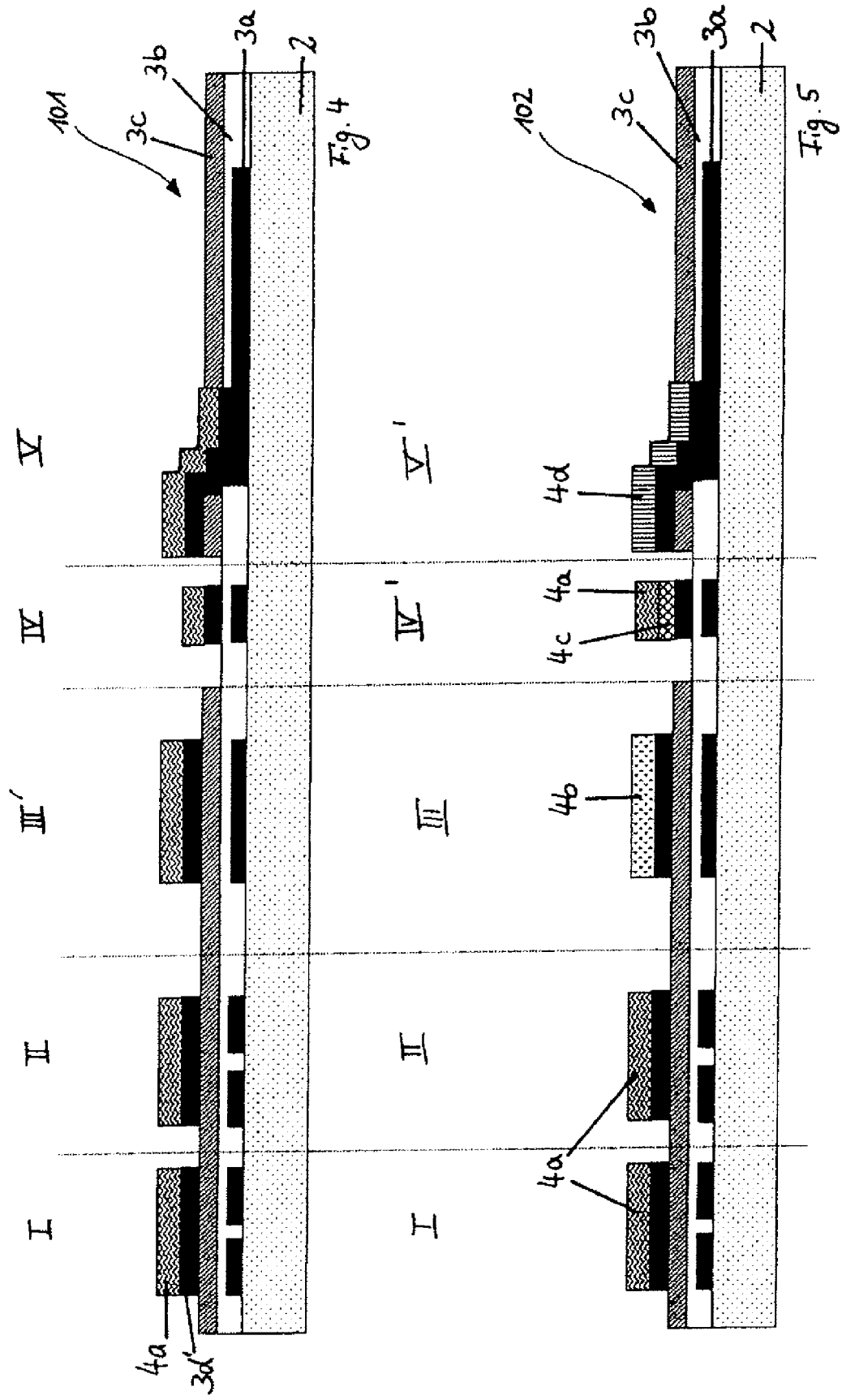

ELECTRONIC CIRCUIT

The invention concerns an electronic circuit including at least two organic components connected together by means of conductor tracks and having a common carrier substrate.

Such electronic circuits are known from DE 101 51 440 C1. Here various electronic components are connected to afford an electronic unit or a circuit, wherein similar components are bundled on a substrate or in an encapsulation to constitute a grouping which are then electronically connected together. To protect the components from environmental influences they are arranged in protected relationship between a substrate film and an encapsulation film.

Such encapsulation is required in particular for organic components as they are particularly susceptible in regard to contamination, light irradiation or mechanical loading.

It is known from DE 10 2004 010 094 B3 for semiconductor components including an organic semiconductor layer to be provided with a protective layer which is intended as protection from environmental influences.

Now the object of the invention is to provide a further electronic circuit of the kind set forth in the opening part of this specification, the sensitive organic components of which are sufficiently protected from environmental influences.

The object is attained by an electronic circuit including at least two organic components connected together by means of conductor tracks and having a common carrier substrate, wherein it is provided that the components and the conductor tracks are formed from layer portions, an uppermost layer portion, remote from the carrier substrate, of the electronic circuit is of a patterned configuration comprising an electrically conducting material, the patterned uppermost layer portion on its side remote from the carrier substrate is provided with at least one protective layer arranged in congruent relationship with the uppermost layer portion, the at least two organic components include at least one first component of a first component type and at least one second component of a second component type different therefrom, and components of the same component type are respectively protected by a protective layer of the same composition and/or the same structure.

The reference to a 'congruent' arrangement of the at least one protective layer with respect to the patterned uppermost layer portion is used to mean in that respect that the at least one protective layer in its surface extent is precisely as large as the patterned uppermost layer portion and is of the same shape. Thus viewed perpendicularly to the plane of the carrier substrate the patterned layer portion and the at least one protective layer are of the same shape and position, wherein the contours of the uppermost layer portion and the protective layer coincide or are disposed exactly one above the other in that view.

Such a circuit permits particularly inexpensive and rational manufacture. The at least one protective layer covers the patterned uppermost layer portion of the electrical circuit and reliably protects components disposed therebeneath as well as the connections between individual components in the form of conductor tracks. As the electrically conducting uppermost layer portion usually provides a large number of electrode surfaces, for example top gate electrodes of OFETs, the sensitive regions of the components are usually disposed immediately therebeneath. In that case in particular mechanical protection is afforded, in particular in relation to pressure forces, shearing forces or abrasion, but depending on the respective composition and/or structure of the at least one protective layer, alternatively or in combination with the mechanical protection, protection is also possible in regard to chemical loadings, in particular due to water vapor, oxygen, contamination and impurities and so forth and/or optical loadings, in particular due to visible radiation, UV radiation and so forth, and/or thermal loading, in particular due to IR radiation and so forth. Thus it is possible for the protective layer also to remain after manufacture of the electronic circuit and reliably protected. In particular it is therefore possible, for example if the electronic circuit is a part of a further electronic circuit, to increase the yield of operable electronic circuits.

Stabilisation of the layer packet of the circuit and a reduction in unwanted separation or lifting phenomena between individual layer portions of the layer packet, which can occur due to lack of or poor interlayer adhesion is possible by the arrangement according to the invention of the protective layer.

In this respect the term organic component is used to denote an electrical component predominantly comprising organic material, in particular comprising organic material in at least 90% by weight. In that case an individual organic component is composed of different layer portions with an electrical function, in particular in the form of thin layers which are not self-supporting, and in addition at least the regions, that can be associated with the layer portions, of a carrier substrate on which the layer portions are disposed. In that respect the individual layer portions can be formed from organic or inorganic material, wherein only organic, only inorganic or organic and inorganic layer portions can be used in combination to form an organic component. Thus an electrical component comprising an organic carrier substrate and exclusively inorganic layer portions with an electrical function is viewed overall as an organic component by virtue of the usually large mass of the carrier substrate in comparison with the mass of the functional layers.

What is also identified as an organic component is in particular such a component which has at least one layer portion comprising an organic, metallorganic and/or organic-inorganic material. That embraces organic, metallorganic and/or organic-inorganic polymers or plastic materials (hybrids), in particular those which in English are identified for example as 'plastics'. That thus involves all kinds of substances with the exception of semiconductors which form classic diodes (germanium, silicon) and the typically metallic conductors. A limitation in a dogmatic sense to organic material as carbon-bearing material is accordingly not intended, rather consideration is also given to the broad use of for example silicones. In addition the expression organic or organic material is not intended to involve any limitation in relation to the molecular size, in particular to polymeric and/or oligomeric materials, but the use of 'small molecules' is certainly also possible. In that respect the term 'polymer' does not contain any information about the actual presence of a polymeric compound.

In general the formation of layer portions is preferably effected by printing, vapor deposition, sputtering, spraying, scattering, pouring, applying by scraping and raking and the like further coating methods. The layer portions with an electrical function are preferably applied from a solution, applied by vapor deposition, sputtering, laminating or embossed on to the carrier substrate by means of a transfer film. Layer portions with an electrical function, which are applied from a solution, are applied for example by printing, pouring, spraying or scraping or raking on to the carrier substrate. A layer portion of a component can involve an electrically conducting layer portion, a semiconducting layer portion or an electrically insulating layer portion.

It has proven advantageous if the at least two organic components of the electronic circuit respectively include at least one layer portion which is formed by means of one of the above-mentioned coating methods, in particular printing.

To form organic layer portions which are formed by an organic material which is dissolved in particular in a solvent, in particular printing methods such as for example intaglio printing, screen printing, offset printing, thermotransfer printing or flexoprinting are appropriate.

In that respect a layer portion can be applied in pattern form or over the full surface area to the carrier substrate or to a carrier substrate already provided with layer portions. Layer portions applied over a full surface area can subsequently be removed again region-wise, for example by etching, laser treatment, washing off with water, dissolving in solvent and so forth to provide a patterned configuration. In that respect layer portions comprising an organic semiconductor material are preferably provided over the full surface area. Layer portions comprising electrically conducting material are mostly of a patterned configuration to provide electrode surfaces and/or conductor tracks. Layer portions of electrically insulating material are provided in pattern form or over the full surface area depending on the respective requirements involved.

The individual layer portions of a component on the carrier substrate usually involve a total layer thickness in the range of between 500 nm and 2000 nm. In general all layer portions are preferably thin layers of a layer thickness of less than 10 µm. An electrically conducting layer portion preferably involves a layer thickness in the range of between 5 nm and about 100 nm, a layer portion comprising a semiconductor material is preferably of a layer thickness in the range of between 10 nm and 300 nm and an electrically insulating layer portion is preferably of a layer thickness in the range of between 50 nm and 2000 nm.

A component can also further have protective and/or auxiliary layers. The layer thickness thereof is preferably between 100 nm and several µm.

In that respect it has also proven advantageous if the at least two organic components include at least two components of the same component type.

Accordingly the electronic circuit may have a first subset of organic components of a first component type, for example OFETs, and at least one further subset of organic components of a further component type different from the first component type, for example organic diodes.

An organic component is in particular one of the following component type:

Field effect transistor (OFET), organic diode, capacitor, resistor, IC chip, vertical electrically conducting connection (via), and so forth, as well as additionally horizontal electrically conducting connections.

The electronic circuit may include not only the at least two organic components but also inorganic components having no organic layer portion. For example field effect transistors, diodes, capacitors, resistors, IC chips, horizontal electrically conducting connections, vertical electrically conducting connections (vias) and so forth can be considered as organic components.

In that respect it has proven advantageous if the at least one protective layer in the region of the electronic circuit is everywhere of the same composition and/or the same structure. Such a design configuration can be rationally and inexpensively produced.

In addition it may be advantageous if the at least one protective layer is of a different composition and/or a different structure in different regions of the electronic circuit. In that way the protective layer can be precisely matched in its action to the component to be protected and the demands thereof and at the same time can provide for rational provision of as many identical protective layer regions as possible.

In addition it has proven advantageous if components of different component type are respectively protected by at least one protective layer, the composition and/or structure of which differs.

Thus components of different component types such as for example OFETs and organic diodes can place quite different demands on the protective layer required. Thus specifically targeted application of a first protective layer to only components of a first component type and a second protective layer, that is different therefrom, to only components of a second component type, and so forth, is advantageously possible.

In that respect the at least one protective layer may at least region-wise be of a structure comprising at least two individual layers which are arranged in mutually superposed stacked relationship. Thus the protective actions of different protective layers can be combined.

It is also advantageously readily possible for different protective layers, that is to say of different composition and/or different structure, to be used for protecting different regions within an individual component.

In that respect suitable materials for forming a protective layer are generally in particular conductive or non-conductive polymers, 'small molecules', a mixture of molecules and polymers, conjugate polymers, photosensitive lacquers, waxes, resins, polymer mixtures and so forth. In particular additives are added to the organic materials such as plasticisers which provide for a sufficiently high level of flexibility of the protective layer or chemically active redox systems or particles as a radiation absorber such as for example ZnO or $TiO_2$ nanoparticles as a UV absorber, or coloring agents, or conductive particles such as graphite or carbon black, or non-conductive particles which act for example as reflectors, and so forth.

It has proven particularly advantageous if the at least one protective layer is a printed protective layer. In particular a protective layer comprising an organic material, in particular a crosslinked organic material, is suitable. Preferably at least one lacquer layer is used for forming the at least one protective layer.

To form at least one printed protective layer the protective layer material is applied preferably in pattern form using intaglio printing, screen printing, offset printing, thermotransfer printing or flexoprinting.

Alternatively thereto the at least one protective layer can first be applied over a large area and then selectively removed again.

A layer thickness for the at least one protective layer is preferably in the range of between 50 nm and 10 µm, in particular in the range of between 100 nm and 2 µm. If a protective layer is made up of a plurality of individual layers that involves the total layer thickness, that is to say the sum of the layer thicknesses of all individual layers.

A particularly advantageous embodiment is one in which the at least one protective layer is structured in pattern form at the same time with the uppermost layer portion which is disposed in immediately adjoining relationship therewith and which is in particular in the form of an electrode plane. In that way the critical active or sensitive regions of the various components are generally automatically protected, such as for example the current channel region in an OFET of a top gate structure, as here the structuring of the electrically conducting uppermost layer portion for forming the gate electrode can be effected simultaneously with structuring of the protective layer. The vertical current channel of a diode is also thus optimally protected as here the structuring of the electrically conducting uppermost layer portion for forming the anode or cathode of the diode can be effected simultaneously with structuring of the protective layer.

In general the contour or the shape of the uppermost layer portion, viewed perpendicularly to the plane of the carrier substrate, if the uppermost layer portion forms electrode surfaces and/or conductor tracks, can be formed substantially independently of an electrically conducting layer portion which is arranged in the layer stack further downwardly, that is to say in the direction of the carrier substrate, that electrically conducting layer portion forming counterpart electrodes in relation to the electrodes of the uppermost layer portion and/or further conductor tracks. Thus electrodes and counterpart electrodes in different planes of the component can be arranged both in mutually superposed congruent relationship or only in mutually overlapping relationship in subregions.

In particular it has proven desirable if the at least one protective layer is adapted to be impermeable or at least substantially impermeable for visible radiation and/or for ultraviolet radiation and/or for IR radiation. The term substantially impermeable is used to denote a protective layer which is impermeable for at least 30%, preferably at least 90%, of the incident radiation, in particular the radiation or radiation components which damage the component, as they are reflected and/or absorbed by the protective layer. In that way the component which is respectively protected thereby is optimally protected from optical and/or thermal loading. In particular a protective layer material containing UV absorber and/or opaque coloring agents is preferred.

It has further proven desirable if the at least one protective layer has a modulus of elasticity in the range of between 0.5 and 5000 $N/mm^2$ and thus has a sufficiently high level of flexibility or bendability for protecting the components or component regions covered therewith.

It is advantageous if the at least one protective layer is resistant to at least one organic solvent. In addition it is desirable if the at least one protective layer is insoluble in water.

At least one protective layer is particularly preferred, which is impervious to water vapor and/or oxygen or which acts at least as a diffusion barrier which markedly reduces the access of water vapor and/or oxygen in the direction of the layer portions of the component with an electrical function. That makes it possible to effectively prevent chemical influencing of organic layer portions.

It is desirable if the carrier substrate is formed by a flexible film. In particular the film is formed by at least one film layer of plastic, glass, paper, metal or a laminate comprising at least two different film layers of such material. However rigid carrier substrates comprising for example ceramic, glass and so forth can also be employed.

The carrier substrate is preferably of a thickness in the range of between 12 µm and 1 mm.

Flexible carrier substrates in band form are preferably processed in that respect in an inexpensive continuous method on a roll-to-roll basis.

If required the electronic circuit according to the invention can also be provided with an encapsulation which is already known from the state of the art in order still more effectively to protect the circuit from harmful influences. The application of at least one cover layer over the full surface area and/or at least a film on the side remote from the carrier substrate of the circuit has proven desirable for that purpose.

FIGS. 1a through 5 are intended to describe the invention by way of example. In the drawings:

FIGS. 1a through 1d show a view in cross-section of the production of a first electronic circuit, FIG. 2 shows a cross-section of a second electronic circuit,
FIG. 3 shows a cross-section of a third electronic circuit,
FIG. 4 shows a cross-section of a fourth electronic circuit,
FIG. 5 shows a cross-section of a fifth electronic circuit.

Hereinafter the same references are used throughout for the same layer portions or components. The circuits according to the invention and the components involved are only shown in cross-section so that an interconnection of the components by means of conductor tracks to afford the electronic circuit is not shown in detail.

FIGS. 1a through 1d show the manufacture of an electronic circuit 1 in cross-section. Two organic components I, II (see FIG. 1d) which are connected together are formed on a carrier substrate 2 of polyester film of a thickness of 36 µm or alternatively 50 µm, the component I being a first OFET and the component II being an identical second OFET.

Figure 1A:
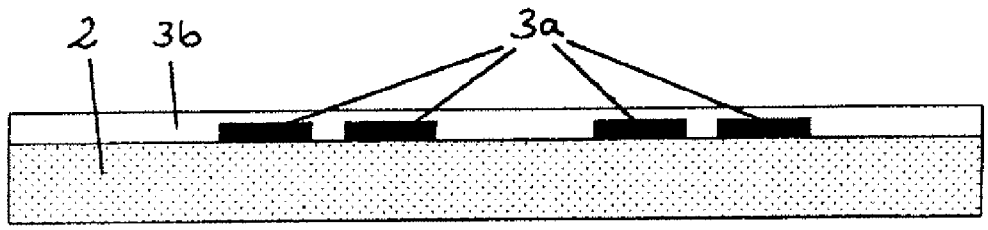

For that purpose as shown in FIG. 1a an electrically conducting first layer portion 3a is produced in pattern form on the carrier substrate 2, the layer portion 3a being formed from an electrically conductive polymer or metal. The first layer portion 3a has a layer thickness in the range of between 20 nm and 50 nm and is here formed in particular from polyaniline, PEDOT/PSS, gold, aluminum, copper or silver. The first layer portion 3a forms the source and drain electrodes of the two components I, II or the OFETs.

A second layer portion 3b comprising an organic semiconductor material, here of zinc oxide or polyalkyl thiophene, is then applied over the full surface area to the patterned first layer portion 3a, in a layer thickness in the range of between 20 nm and 80 nm.

Figure 1B:
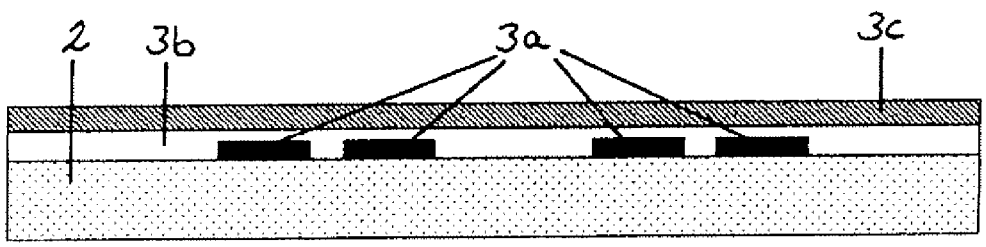

As shown in FIG. 1b a third layer portion 3c comprising an electrically insulating material, here polymethylmethacrylate, PHS or polyhydroxystyrene, is applied over the full surface area to the second layer portion 3b in a layer thickness in the range of between 400 nm and 600 nm.

Figure 1C:
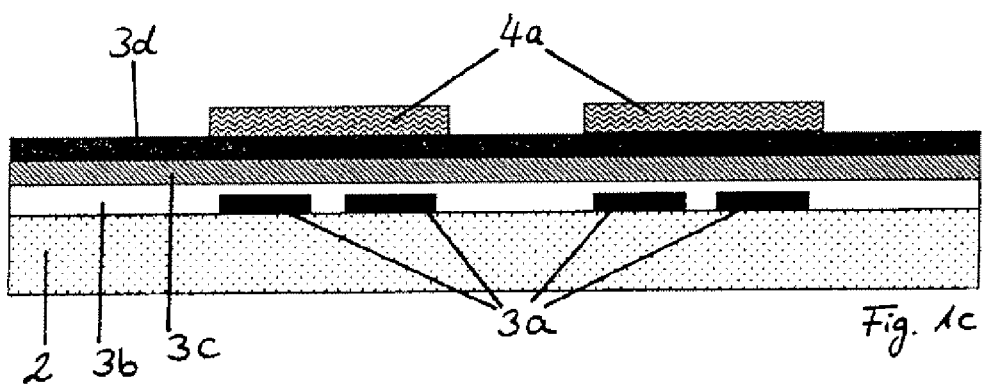

As shown in FIG. 1c a fourth layer portion 3d which here subsequently forms an uppermost layer portion 3d' (see FIG. 1d) of the electrical circuit 1, comprising an electrically conductive material, in particular an electrically conductive polymer or metal, is produced over the full surface area on the third layer portion 3c. The fourth layer portion 3d is of a layer thickness of 50 nm or alternatively 100 nm and is formed here in particular from polyaniline, PEDOT/PSS, gold, aluminum, copper, silver or titanium.

A protective layer 4a is now applied in pattern form to the fourth layer portion 3d. The protective layer 4a is formed here by means of a lacquer which has at least one of the following constituents dissolved in an organic solvent, in particular an alcohol:

a) carbon black/graphite-filled polymer solution or solutions, from Acheson, or b) printing lacquer containing carbon black and/or graphite based on poiyvinylbutyral and nitrocellulose.

The protective layer 4a which is present after hardening of the lacquer is of such a nature that it is resistant to a solvent or etching agent with which the fourth layer portion 3d can be removed.

Now the regions of the fourth layer portion 3d, that are not covered by the protective layer 4a, are removed. The protective layer 4a is now produced in congruent relationship with an uppermost layer portion 3d' formed in pattern configuration from the fourth layer portion 3d. The uppermost layer portion 3d' forms the top gate electrode of the OFETs and conductor tracks, not shown in detail, for the interconnection thereof. The sensitive regions of the two components I, II or the two OFETs as well as the conductor tracks of the electronic circuit 1, formed by the uppermost layer portion 3d', are optimally protected by the protective layer 4a from harmful environmental influences, in particular mechanical damage.

Figure 1D:
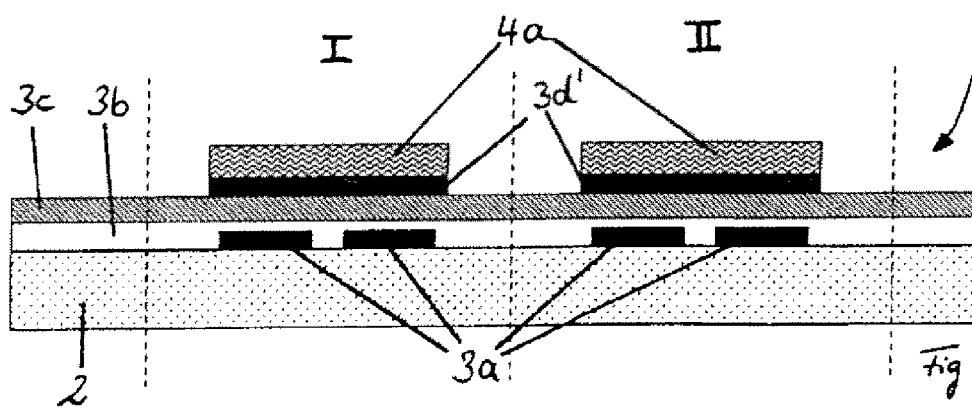
Figure 2:
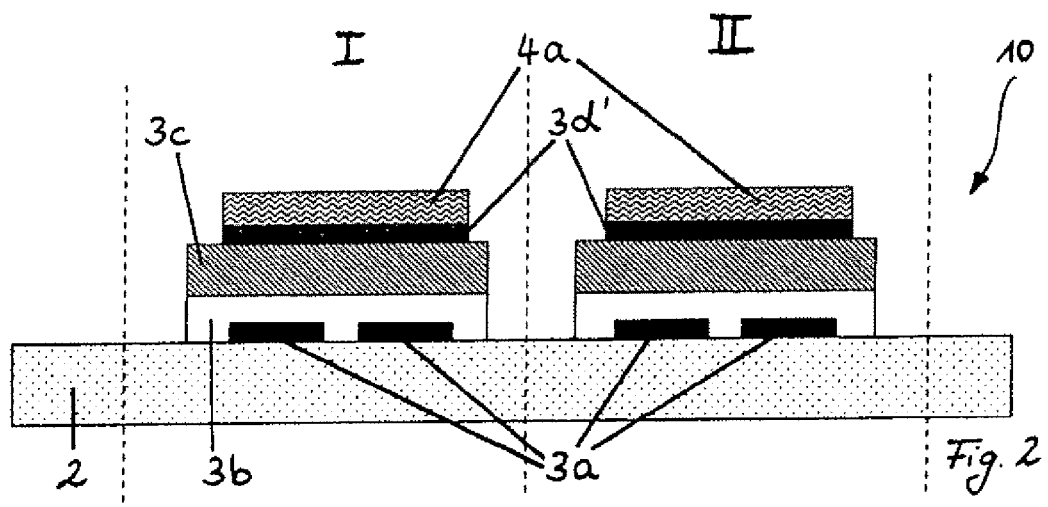

FIG. 2 shows a view in cross-section of a second electronic circuit 10 in which there are also two interconnected components I, II in the form of OFETs. Unlike the electronic circuit 1 shown in FIG. 1d here the second layer portion 3b and the third layer portion 3c are produced in pattern form.

Figure 3:
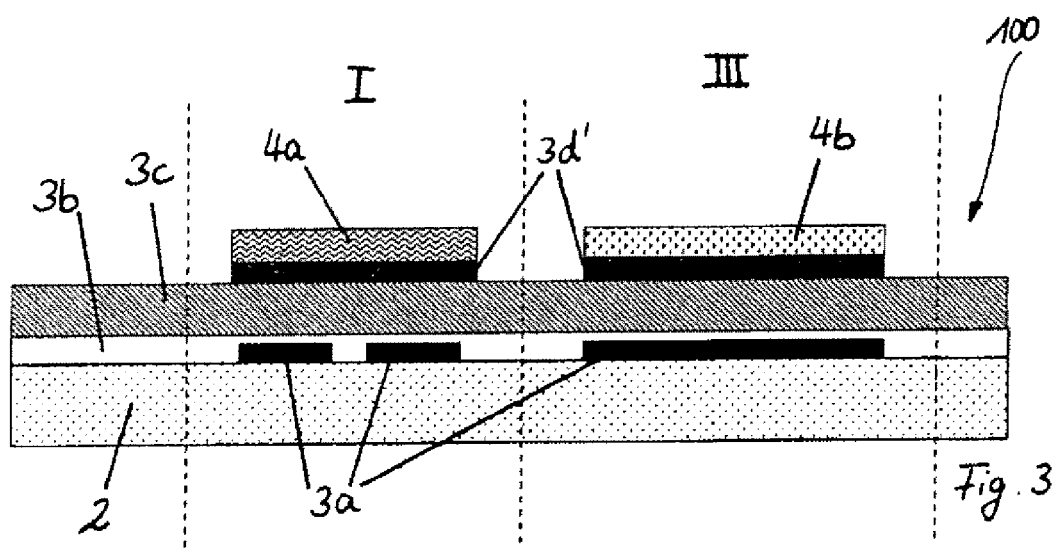

FIG. 3 shows a view in cross-section of a third electronic circuit 100 in which there are two different components I, III. The component I, an OFET, is protected as shown in FIG. 1d with the protective layer 4a. The component III is a capacitor protected with a further protective layer 4b. Provided in the region of the component III on the carrier substrate 2 in this sequence are a first capacitor plate formed by the layer portion 3a, an organic semiconductor layer formed from the second layer portion 3b, an electrically insulating layer formed by the third layer portion 3c, a second capacitor plate formed from the uppermost layer portion 3d' and the further protective layer 4b.

In this case the protective layers 4a, 4b are different in their composition and are adapted directly to the component to be protected. As described hereinbefore in relation to FIG. 1c the protective layer 4a is formed from a lacquer layer pigmented with carbon black. The further protective layer 4b is formed by a wax-based thermotransfer lacquer.

FIG. 4 shows a view in cross-section of a fourth electronic circuit 101 in which the components I, II in the form of OFETs as shown in FIG. 1d, a component III' in the form of a capacitor similarly to FIG. 3, a component IV in the form of an organic diode and a component V in the form of a vertical electrically conducting connection or a through-connecting means through the second and third layer portions 3b, 3c, a so-called 'via', are arranged on a common carrier substrate 2.

In the region of the component IV, a first electrode of the organic diode comprising the first layer portion 3a, an organic semiconductor layer comprising the second layer portion 3b, a second electrode of the organic diode comprising the uppermost layer portion 3d' and the protective layer 4a are arranged on the carrier substrate 2.

Disposed on the carrier substrate 2 in the region V is a conductor track comprising the first layer portion 3a which is electrically conductingly connected to the patterned uppermost layer portion 3d' by way of an opening in the second and the third layer portions 3b, 3c. The arrangement of the electrically conducting layer portions 3a, 3b forms the via which is also covered by the protective layer 4a.

Provided in the region of the component V is an electrically conducting connection between the first layer portion 3a and the patterned uppermost layer portion 3d', wherein conductor tracks are provided for electrically connecting at least a part of the components I, II, III, IV, V.

Thus provided on the components I through V which are in the form of two OFETs, a capacitor, an organic diode and a via, as well as the conductor tracks for the electrical connection thereof, which are formed by the uppermost layer portion 3d', is a protective layer 4a which precisely covers the uppermost layer portion 3d' and protects the components I through V from environmental influences.

FIG. 5 shows a fifth electronic circuit 102 according to the invention in cross-section. In this case substantially the same components as shown in FIG. 4 are disposed on the common carrier substrate 2.

Unlike FIG. 4 however in this case only the components I and II or the OFETs are covered with a first protective layer 4a as shown in FIG. 1d. The component III in the form of the capacitor is covered with a second protective layer 4b as shown in FIG. 3. The component IV in the form of the organic diode is covered with a third protective layer composed of two individual protective layers 4c and 4a (as shown in FIG. 1d). The component V in the form of the via is provided with a fourth protective layer 4d. In this case the protective layers 4a; 4b; 4c, 4a; 4d differ in composition and structure.

The formation of a multiplicity of further electronic circuits with organic components, possibly also with inorganic components, is easily possible for the man skilled in the art.

The invention claimed is:

1. An electronic circuit having opposite sides comprising:
a carrier substrate;
at least two organic components interconnected by conductor tracks and located on the carrier substrate,
the at least two organic components and the conductor tracks being formed from layer portions including an uppermost layer portion remote from the carrier substrate, which uppermost layer portion has a patterned configuration comprising an electrically conducting material and having a side remote from the carrier substrate;
the patterned uppermost layer portion side remote from the carrier substrate having at least one protective layer in congruent relationship with the uppermost layer portion;
the at least two organic components including at least one first component of a first component type and at least one second component of a second component type different from the first type;
wherein components of the same component type are respectively protected by a protective layer of the same composition and/or the same structure; and
the at least one protective layer for covering the full surface of a side of the circuit and/or at least one film for covering the full surface area of a side of the circuit arranged on the side of the circuit that is remote from the carrier substrate.

2. The electronic circuit as set forth in claim 1 wherein the at least two organic components respectively include at least one printed layer portion.

3. The electronic circuit as set forth in claim 1 wherein the at least two organic components include at least two components of the same component type.

4. The electronic circuit as set forth in claim 1 wherein the at least two organic components include component types in the form of field effect transistors, diodes, capacitors, resistors, IC chips or vias.

5. The electronic circuit as set forth in claim 1 wherein the at least one protective layer in the region of the electronic circuit is everywhere of the same composition and/or the same structure.

6. The electronic circuit as set forth in claim 1 wherein the at least one protective layer in the region of the electronic circuit is of a different composition and/or a different structure corresponding to the different component types.

7. The electronic circuit as set forth in claim 6 wherein components of differing component type are respectively protected by at least one protective layer, the composition and/or structure of which differs according to the corresponding component type.

8. The electronic circuit as set forth in claim 5 wherein the at least one protective layer has at least region-wise a structure corresponding to a given component region and comprising at least two Individual protective layers arranged in mutually superposed stacked relationship.

9. An electronic circuit as set forth in claim 1 wherein the at least one protective layer is printed.

10. The electronic circuit as set forth in claim 1 wherein the at least one protective layer is organic.

11. The electronic circuit as set forth in claim 10 wherein the at least one protective layer is formed from a crosslinked organic material.

12. The electronic circuit as set forth in claim 1 wherein the at least one protective layer is impermeable to visible radiation and/or ultraviolet radiation.

13. The electronic circuit as set forth in claim 1 wherein the at least one protective layer has a modulus of elasticity in the range of between 0.5 and 5000 N/mm$^2$.

14. An electronic circuit as set forth in claim 1 wherein the at least one protective layer is resistant to at least one organic solvent.

15. An electronic circuit as set forth in claim 1 wherein the at least one protective layer is insoluble in water.

16. The electronic circuit as set forth in claim 1 wherein the at least one protective layer is impervious to water vapor and/or oxygen.

17. The electronic circuit as set forth in claim 1 wherein the carrier substrate is a flexible film.

18. The electronic circuit as set forth in claim 17 wherein the film includes at least one film layer of at least one material comprising plastic, glass, paper, metal or a laminate comprising at least two different film layers of said materials.

* * * * *